United States Patent [19]

Okuyama

[11] Patent Number: 4,918,503
[45] Date of Patent: Apr. 17, 1990

[54] DYNAMIC RANDOM ACCESS MEMORY DEVICE HAVING A PLURALITY OF ONE TRANSISTOR TYPE MEMORY CELLS

[75] Inventor: Yasushi Okuyama, Tokyo, Japan

[73] Assignee: NEC Corporation, Tokyo, Japan

[21] Appl. No.: 181,030

[22] Filed: Apr. 13, 1988

[30] Foreign Application Priority Data

Apr. 13, 1987 [JP] Japan .................................. 62-91167

[51] Int. Cl.$^4$ ..................... H01L 29/78; H01L 29/34; H01L 27/02; H01L 27/10
[52] U.S. Cl. ................................... 357/23.6; 357/54; 357/55; 357/45; 437/52
[58] Field of Search .................... 357/23.6, 54; 437/52

[56] References Cited

U.S. PATENT DOCUMENTS 4,801,989 1/1989 Taguchi .............................. 357/23.6

FOREIGN PATENT DOCUMENTS 152059 8/1985 Japan ................................... 357/23.6
219661 9/1987 Japan ................................... 357/23.6

Primary Examiner—Rolf Hille
Assistant Examiner—Robert P. Limanek
Attorney, Agent, or Firm—Sughrue, Mion, Zinn, Macpeak & Seas

[57] ABSTRACT

A dynamic random access memory device having one transistor type memory cells is disclosed. The memory cell includes a trench type storage capacitor and a transfer gate transistor. The dielectric film of the capacitor is formed in the trench such that the upper part of the film above the upper wall of the trench adjacent to the major surface of the substrate is thicker than the other parts of the film in the trench.

10 Claims, 3 Drawing Sheets

FIG. 4
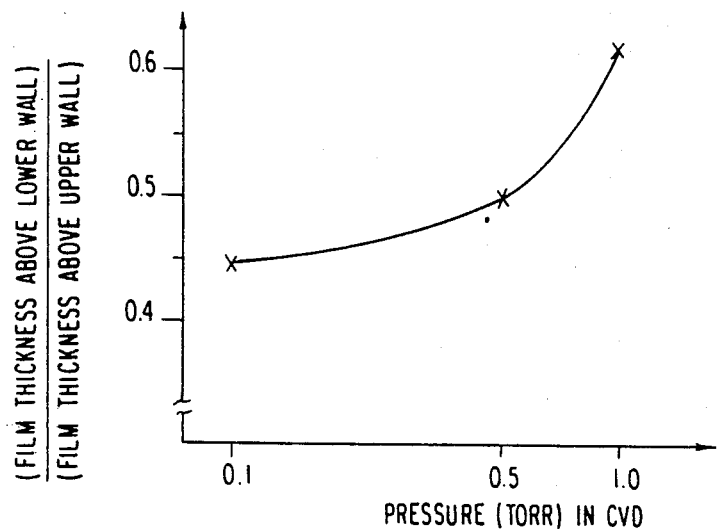
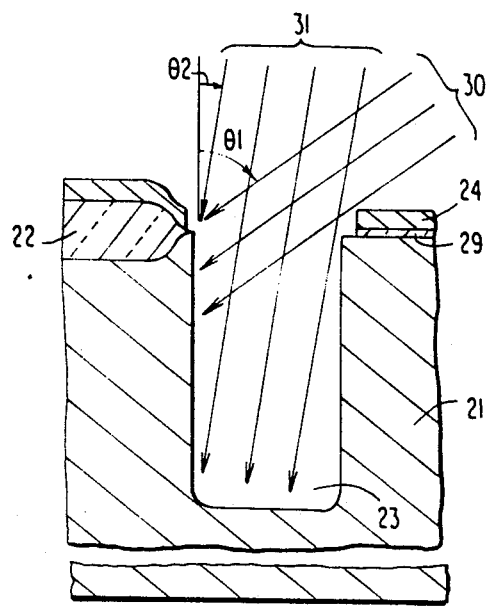
FIG. 5A
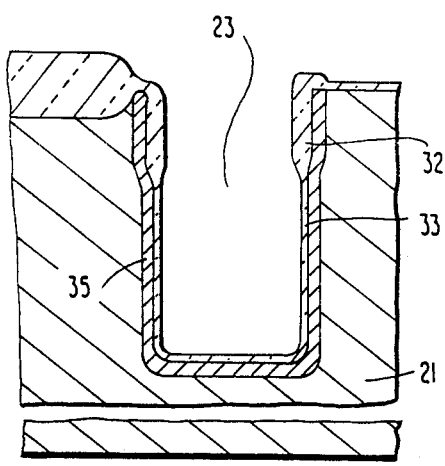
FIG. 5B

DYNAMIC RANDOM ACCESS MEMORY DEVICE HAVING A PLURALITY OF ONE TRANSISTOR TYPE MEMORY CELLS

BACKGROUND OF THE INVENTION

The present invention relates to a dynamic random access memory device having a plurality of one transistor type memory cells each including one transfer gate transistor and one storage capacitor connected to the transfer gate transistor.

Recently, the surface area occupied by each memory cell has become smaller because of the increasing number of memory cells on one semiconductor chip. Consequently, a sufficient capacitance of the storage capacitor is hardly obtained. To cope with this problem, a trench capacitor technology was proposed by, for example, Ralph J. Jaccodine et al. in U.S. Pat. No. 4,353,086, in which a trench is grooved from a major flat surface of a semiconductor substrate thereinto and a dielectric film of the capacitor is provided on the side wall of the trench. A capacitor electrode is formed on the dielectric film within the trench. In the prior art, the dielectric film is required to be a uniform thickness on all side wall portions including the lower portion adjacent to the bottom of the trench and the upper portion adjacent to the major surface of the substrate. In the prior art trench capacitor memory cell, however, an unfavorable leakage current is likely to flow between the capacitor electrode and the transistor in a level higher than that of a conventional planar capacitor type memory cell in which the storage capacitor is formed on the major flat surface of the substrate. The leakage current in the trench capacitor memory cell would be mainly flowed through the dielectric film between the capacitor electrode and the upper side wall portion of the trench formed by an impurity region having a conductivity type opposite to the raw substrate and connected to one of source and drain regions of the transistors. Therefore, the trench capacitor memory device in the prior art cannot be expected to generate a high production yield and a highly reliable device. Further, a thinner dielectric film for obtaining a higher capacitance cannot be realized in the prior art trench capacitor technology.

SUMMARY OF THE INVENTION

Accordingly, an object of the present invention is to provide a dynamic random access memory device of a trench capacitor type which can decrease the leakage current between the capacitor electrode of the trench capacitor and the transfer gate transistor thereby realizing a high yield and high reliability and an increase of the capacitance of the trench capacitor.

According to a feature of the present invention, there is provided a dynamic random access memory device which comprises a semiconductor substrate of one conductivity type and having a major surface, a transfer gate transistor formed on the major surface of the substrate and having source and drain regions of a conductivity type opposite to the substrate, a trench formed in the substrate from the major surface of the substrate into the substrate, the trench having an upper wall adjacent to the major surface of the substrate and a lower wall adjacent to the upper wall continuously and including a bottom portion, an impurity layer of a conductivity type opposite to the substrate formed on the upper and lower walls of the trench and connected to one of the source and drain regions of the transistor, a dielectric film of a storage capacitor, the dielectric film including a first portion provided on the upper wall of the trench and a second portion provided on the lower wall of the trench, the first portion of the dielectric film being thicker than the second portion of the dielectric film, and a capacitor electrode formed on the first and second portions of the dielectric film within the trench. To decrease the leakage current effectively so such a level as the planar capacitor memory cell, the depth of the upper wall, on which the thicker dielectric film, that is, the first portion of the dielectric film is provided, is favorably 0.5 μm or more from the major surface of the substrate. On the other hand, the upper wall and the thicker dielectric film thereon is used as a part of the capacitor and therefore, the depth is favorably 2.0 μm or less. The dielectric film of the capacitor may consist of a first silicon oxide ($SiO_2$) film on the upper and lower walls of the trench with a substantially uniform thickness, and a silicon nitride ($Si_3N_4$) film on the surface of the first silicon oxide film, the thickness of the silicon nitride film above the upper wall of the trench being larger than the thickness of the silicon nitride film above the lower wall of the trench. The dielectric film mentioned above may include a second silicon oxide ($SiO_2$) film on the surface of silicon nitride film above the upper and lower walls of the trench with a substantially uniform thickness, whereby the first portion of the dielectric film is constituted by the first silicon oxide film, the thick silicon nitride film and the second silicon oxide film, and the second portion of the dielectric film is constituted by the first silicon oxide film, the thin silicon nitride film and the second silicon oxide film. The first and second silicon oxide films may be provided through heat treatments under an atmosphere for oxidation, such as oxygen atmosphere or steam atmosphere, and the silicon nitride film may be provided by a chemical vapour deposition (CVD) method. The thermally grown second dioxide film is useful to fill minute pinholes in the silicon nitride film and therefore, its thickness is favorably 2 nm (20 Å) or more. On the other hand, to enhance the capacitance its thickness is favorably 6 nm (60 Å) or less. In the practical memory device, the thickness of the silicon nitride film above the upper side wall is favorably 1.5 times or more and 3.0 times or less the thickness of the silicon nitride film above the lower side wall of the trench. To decrease the leakage current effectively to the level of the planar capacitor type memory cell, in which the storage capacitor is provided on the major surface of the substrate, the lower limit of 1.5 times is favorably defined. On the other hand, the upper side wall and the first portion of the dielectric film including the thicker silicon nitride film is used as a part of the storage capacitor, and therefore the thickness of the silicon nitride film above the upper wall is favorably defined as its upper limit to 3.0 times the thickness of the silicon nitrode above the lower wall. For example, if the thickness of the silicon nitride film above the lower wall is 4 nm (40 Å), the thickness of the silicon nitride film above the upper wall may range from 6 nm to 12 nm. The dielectric film may be constituted only by a thermally grown silicon oxide ($SiO_2$) film. The impurity layer may be beforehand provided and be present when any voltage is not applied to the capacitor electrode. Or else, the impurity layer may be produced when a voltage is applied to the capacitor electrode.

BRIEF DESCRIPTION OF THE DRAWINGS

FIG. 3 and FIG. 4 show the variations of the thickness of the silicon nitride film between on the upper side wall and on the lower side of the trench in accordance with the conditions of CVD process, respectively; and FIGS. 5A and 5B are cross-sectional views showing process steps in sequence for manufacturing a second embodiment of the present invention.

EMBODIMENT

Figure 1:
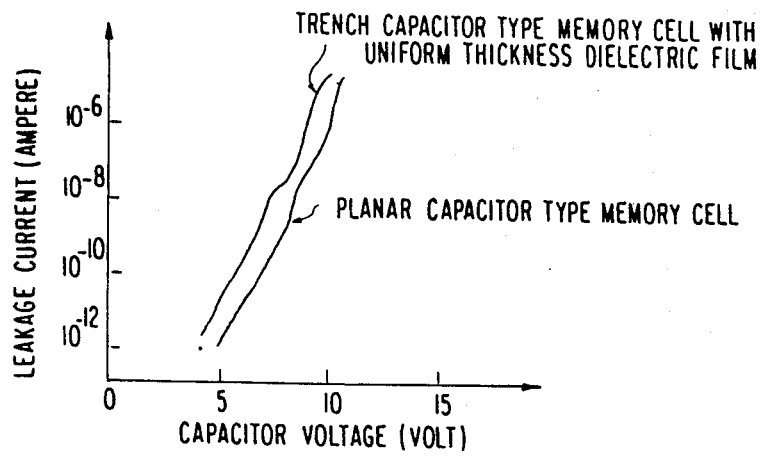
FIG. 1 shows the leakage currents in the trench capacitor type memory cell in which the dielectric film is formed on the entire portions of the trench with the uniform thickness and the conventional planar capacitor type memory cell.

FIG. 1 shows experimental results of the leakage current between the capacitor electrode and the transfer gate transistor when the voltage applied to the capacitor electrode is varied. In the specimen of the trench capacitor type memory cell, the dielectric film of the capacitor was formed in the trench with substantially uniform thickness from the upper wall portion adjacent to the major surface of the substrate to the lower wall including the bottom, entirely. More particularly, the dielectric film was constituted by a first silicon oxide film of 4 nm thickness attached to the entire wall portions of the trench, a silicon nitride film of 3 nm thickness attached on the first silicon oxide film with the substantially uniform thickness and a second silicon oxide film of 3 nm thickness attached on the silicon nitride film. Each of films had the uniform thickness in every portion, and therefore the dielectric film of the storage capacitor in the specimen had the substantially uniform thickness on all portions of the trench. The specimen of the conventional planar capacitor type memory cell had a dielectric film of the storage capacitor formed on the flat major surface of the substrate and composed of the same laminated structure as the trench capacitor type mentioned above, that is, of a first silicon oxide film of uniform 4 nm thickness, a silicon nitride film of uniform 3 nm thickness and a second silicon oxide film of uniform 3 nm thickness. The other conditions such as the capacitor area, the shape of the transfer gate structure, etc. were identical in both specimens. Apparently from FIG. 1, the trench capacitor type memory cell of uniform dielectric film thickness flows a larger leakage current than the conventional planar capacitor type memory cell in every voltage level applied to the capacitor electrode. The phenomenon would be caused by a concentration of the electric field at the corner edge between the upper side wall of the trench and the major surface of the substrate.

Figure 2A:
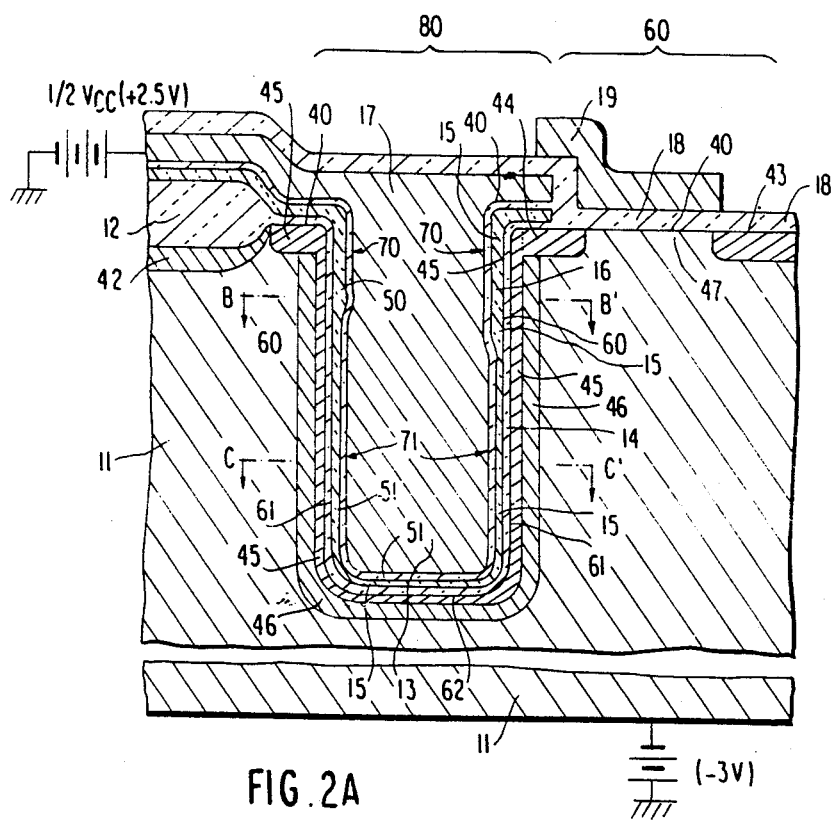
FIG. 2A is a cross-sectional view of a first embodiment of the present invention.
Figure 2B:
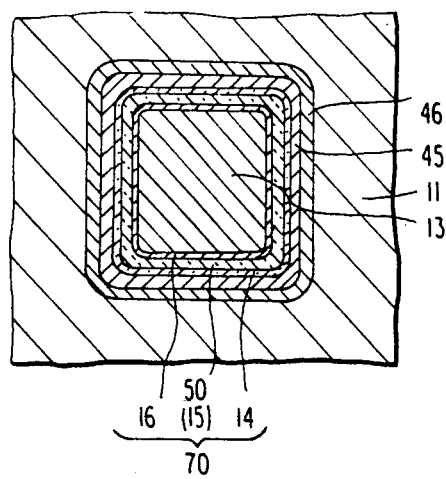
FIGS. 2B and 2C are cross-sectional views taken along lines B-B' and C-C' in FIG. 2A as viewed in the direction of arrows, respectively.
Figure 2C:
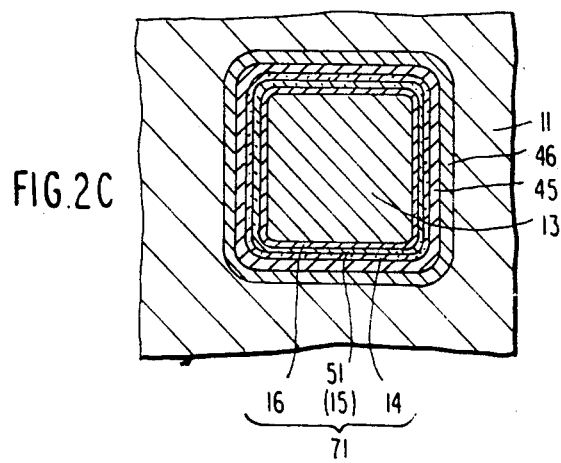

Referring to FIGS. 2A to 2C, a first embodiment of the present invention will be explained. An isolation region consisting of a thick field insulating layer 12 of silicon oxide ($SiO_2$) and a $P^+$-type channel stopper region 42 thereunder is selectively formed on a flat major surface 40 of a P-type silicon substrate 11 having the impurity concentration of $2 \times 10^{15}$ atoms/cm$^3$. A plurality of element forming areas of the substrate are delineated by the isolation region, and a plurality of memory cells are formed in respective element forming areas. In FIG. 2, only one memory cell is exemplified. The memory cell is constituted by an insulated gate field effect transistor 60 as a transfer gate transistor and a storage capacitor 80 connected to the transistor 60. The transistor 60 includes an $N^+$-type impurity region 43 formed on the major surface of the substrate and connected to a digit line (not shown) and used as one of source and drain of the transistor, and an $N^+$-type impurity region 44 formed on the major surface of the substrate, connected to the storage capacitor and used as the other of source and drain of the transistor. On a channel region 47 between the source and drain, a gate insulating film 18 of silicon oxide ($SiO_2$) is formed, and a gate electrode 19 is formed on the gate insulating film 18 and coupled to a word line (not shown). The storage capacitor 80 is provided in a trench 13 formed in the substrate from the major surface inwardly. The trench 13 has a square plan shape of 1.2 μm × 1.2 μm and a depth (depth from the major surface 40 to the bottom 62 of 5 82 m, and surrounded by a ring shape side wall and the bottom 62. The side wall consists of a ring shape upper side wall 60 adjacent to the major surface 40, and a ring shape lower side wall 61 adjacent to and continuously formed with the upper side wall 60 and adjacent to the bottom wall 62. Therefore, the upper wall of the trench is constituted by the upper side wall 60, and the lower wall of the trench is constituted by the lower side wall 61 and the bottom wall 62. An $N^+$-type impurity region 45 having a higher impurity concentration of $10^{18}$ to $10^{20}$ atoms/cm$^3$ is formed on the entire side wall portions and the entire bottom so that the entire side wall and bottom of the trench is made by the $N^+$-type impurity region 45. The $N^+$-type impurity region 45 of the capacitor 80 is connected to the $N^+$-type impurity region 44 of the transistor 60 and surrounded by a $P^+$-type impurity region 46 having a higher impurity concentration of $10^{17}$ atoms/cm$^3$. Through a heat treatment of 900° C. under dry oxygen atmosphere, a first silicon oxide ($SiO_2$) film 14 of 4 nm thickness is formed with the uniformed thickness on the upper and lower side walls 60, 61 and on the bottom wall 62 continuously. A silicon nitride ($Si_3N_4$) film 15 is deposited on the first silicon oxide film 14 such that the thickness of the film 15 above the upper side wall 60, which has the depth of about 1.7 μm from the major surface 40, is 12 nm, and the thickness of the film 15 above the lower side wall 61, that is, remaining side wall, and above the bottom wall 62 is 6 nm. Next, the silicon nitride film 15 is subjected to a heat treatment of 950° C. under steam atmosphere. By this heat treatment, the surface of the silicon nitride film 15 is entirely converted by 1.7 nm to a second silicon oxide ($SiO_2$) film 16 of 3.0 nm thickness, and the second silicon oxide film 16 is formed above entire portion with the constant thickness. Consequently, a portion, that is, a first portion 50 of the silicon nitride film 15 above the upper side wall 60 becomes its thickness to 10.3 nm, and a portion, that is, a second portion 51 of the silicon nitride film 15 above the lower side wall 61 and the bottom 62 becomes its thickness to 4.3 nm. Then, the dielectric film of the capacitor 80 is constituted by an upper part 70 of the dielectric film consisting of the first silicon oxide film 14 of 4 nm thickness, a first portion 50 of 10.3 nm thickness of the silicon nitride film 15 and the second silicon oxide film 16 of 3 nm thickness, and by a lower part 71 of the dielectric film consisting of the first silicon oxide film 14 of 4 nm thickness, a second portion 51 of 4.3 nm thickness of the silicon nitride film 15 and the second silicon oxide film 16 of 3 nm thickness. A capacitor electrode 17 made of polycrystalline silicon doped with N-type or P-type impurity is formed on the second silicon oxide film 16 and fills the trench. The capacitor electrode 17 is ledout on to the field insulating layer 12 and commonly connected to the other capacitor electrodes (not shown) from the other memory cells (not shown), and to which a constant voltage such as 1/2 Vcc is applied. The capacitor electrode 17, the dielectric film 70, 71 and the N+-type impurity region 45 constitute a MOS capacitor of the storage capacitor and the N+-type impurity region 45 and the P+-type impurity region 46 constitute a PN junction capacitor of the storage capacitor. The N+-type impurity region 45 is used as an inversion layer connected to the N+-type source or drain region 44 of the transistor 60. In the embodiment, the N+-type impurity region 45 is formed beforehand in the manufacturing process step. However, the inversion layer 45 may be produced when a voltage is supplied to the capacitor electrode without forming beforehand. The P+-type impurity region 46 is provided to enhance the PN junction capacitance. The region 46 may be omitted to provide. In this case, the PN junction capacitance is formed with the raw material of the P-type substrate 11.

In the operation, a constant voltage, for example, of ½ Vcc (= +2.5 V) is supplied to the capacitor electrode 17, and a back gate bias voltage, for example, of −3 V is supplied to the silicon substrate 11. When a word line is a high potential level, the transistor 60 becomes ON state by the polycrystalline silicon gate electrode 19 connected to the word line, and a signal of +5 V (H state) or 0 V (L state) from a digit line is changed its level to +4 V or 0 V, respectively through the transistor and applied to the N+-type impurity region 45 of the capacitor 80. The capacitor electrode 17 is supplied with the voltage of +2.5 V (½ Vcc) as mentioned above, and therefore the potential difference of 1.5 V (H state) or 2.5 V (L state) is generated between both sides of the dielectric film of the capacitor. When the dielectric film is a laminated layer which consists of a silicon oxide film of 4 nm thickness, a silicon nitride film of 4.3 nm thickness and a silicon oxide film of 3 nm thickness, the electric field intensity E can be calculated as 1.6 MV/cm or 2.8 MV/cm, respectively. However, at the upper edge corner of the trench, a high electric field intensity higher than 2.8 MV/cm would be caused by the concentration of the electric field, and therefore a leakage current of a high level is unfavorably generated through the dielectric film at the upper portion if a uniform thickness dielectric film is provided over the entire portion of the trench.

According to the present embodiment, the thickness of the silicon nitride film of this portion is set to 10.3 nm (12 nm-1.7 nm) which is thicker than that of the other portions. Therefore, the enhancement of the electric field at the upper portion can be suppressed, and the leakage current can be deppressed to such a level as the leakage current in the planar capacitor type memory cell.

The thickness distribution of the silicon nitride film in the embodiment can be obtained by controlling conditions of CVD process in accordance with the plane shape and sizes of the trench and the trench depth.

Figure 3:
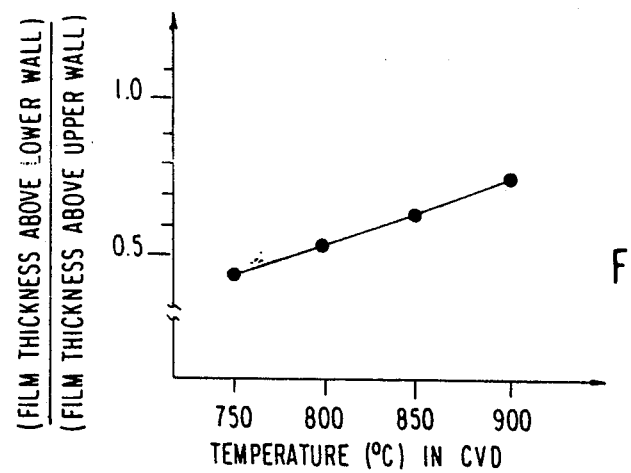

FIG. 3 and FIG. 4 exemplify the results of experiments for deciding the conditions in manufacturing the practical memory device.

Many specimens of silicon substrate were prepared. In each of the substrate, at least one trench having a square plan shape of 1.2 μm × 1.2 μm and a depth of 5.0 μm from the major surface of the substrate was formed and a silicon dioxide film ($SiO_2$) of 4 nm thickness was grown uniformly on the entire side and bottom walls of the trench by a thermal oxidation method.

A silicon nitride film ($Si_3N_4$) was deposited by the decomposition reaction of a mixture gas consisting of monosilane gas ($SiH_4$) and ammonia ($NH_3$) gas; flowing ratio of these gasses being 1:30, under 0.5 Torr. (66.7 pascal). When the temperature of the CVD was changed between 750° C. to 900° C., a characteristic of the ratio of (the thickness of the lower portion of $Si_3N_4$ film) to (the thickness of the upper portion of $Si_3N_4$ film) was obtained as shown in FIG. 3; where the lower portion of $Si_3N_4$ film is of the film deposited on the $SiO_2$ film above the bottom and the lower side wall of the trench, and the upper portion of $Si_3N_4$ film is of the film deposited on the $SiO_2$ film above the upper side wall of the trench. Now, a reaction of $SiH_4$ and $NH_3$ was favorable than that of $SiH_2Cl_2$ and $NH_3$ because the former can change the film thickness between the upper and lower portions more largely than the latter case. FIG. 4 shows a characteristic of the ratio when the pressure of the CVD process was changed between 0.1 to 0.8 Torr. at 800° C. temperature. The other conditions in FIG. 4 were the same as in FIG. 3. The characteristics in Figs. 3 and 4 depend on the shape and dimensions of the trench. Therefore, when a trench having the shape and dimensions different from the above-mentioned trench is employed in a memory cell, other corresponding experiments for deciding adequate condition of CVD process are necessary.

The silicon nitride ($Si_3N_4$) film 15 including the first portion 50 and the second portion 51 in the first embodiment is deposited by the following CVD conditions obtained by the experiments shown in FIGS. 3 and 4. That is, $SiH_4$ gas and $NH_3$ gas are supplied with keeping the volume ratio of 1:30 at the temperature of 800° C. under 0.5 Torr. (66.7 pascal pressure).

Referring to FIGS. 5A and 5B, a second embodiment of the present invention will be explained. In these drawings, only parts which are concerned to the present invention are shown. That is, the well known components such as the capacitor electrode attached the dielectric film and filling the trench, the transfer gate transistor, etc. are omitted. Except for the dielectric film's structure, the second embodiment has the same components as the first embodiment with the same operation. In the second embodiment, the dielectric film of the trench capacitor is constituted only by silicon dioxide ($SiO_2$). As shown in FIG. 5A, $As^+$ ions are implanted into a trench 23 grooved in a P-type silicon substrate 21 on which a thick field insulating layer 22, a thin insulating film 29 and a mask member 24 are provided. The ion implantation is devided into two stpes. In the first step, $As^+$ ions 30 are implanted at a dosage of $1 \times 10^{15}/cm^2$ by 150 KeV energy along a passage inclined from the side wall surface of the trench by $\theta_1$ of 60°. Next, in the second steps, $As^+$ ions 31 are implanted at a dosage of $3 \times 10^{14}/cm^2$ by 100 KeV energy along a passage inclined from the side wall surface of the trench by $\theta_2$ of 7°. During the ion implantation process steps, the silicon substrate 21, that is, the silicon wafer is horizontally rotated. Thereafter, by a heat treatment at 900° C. under dry oxygen ($O_2$) atmosphere, a silicon dioxide film 32 having the thickness of 8 nm is formed at the upper side wall portion of the trench where the higher density $As^+$ ions of $1 \times 10^{15}/cm^2$ have been implanted in the first ion implantation step and a silicon dioxide film 33 having the thickness of 4 nm is formed at the lower side wall portion and the bottom of the trench where the lower density As+ ions of $3 \times 10^{14}/cm^2$ have been implanted in the second ion implantation step. By the heat treatment, an N+-type impurity region 35 (corresponding to the N+-type inversion layer 45 in the first embodiment) by the implanted arsenic (As) ions is formed at the entire wall portions of the trench, that is, the dielectric film of the storage capacitor consisting of the silicon dioxide films 32 and 33 are provided on the N+-type impurity region 35 (FIG. 5B).

What is claimed is:

1. A dynamic random access memory device comprising a semiconductor substrate of one conductivity type and having a major surface, a transfer gate transistor formed on said major surface of said substrate and having source and drain regions of a conductivity type opposite to said substrate, a trench formed in said substrate from said major surface of said substrate into said substrate, said trench having an upper wall adjacent to said major surface of said substrate and a lower wall adjacent to said upper wall continuously and including a bottom portion, an impurity layer of a conductivity type opposite to said substrate formed on said upper and lower walls of said trench and connected to one of said source and drain regions of said transistor, a dielectric film of a storage capacitor, said dielectric film including a first portion provided on said upper wall of said trench and a second portion provided on said lower wall of said trench, said first portion of said dielectric film being thicker than said second portion of said dielectric film, and a capacitor electrode continuously formed on said first and second portions of said dielectric film within said trench.

2. A memory device of claim 1, in which the depth of said upper wall of said trench from said major surface of said substrate ranges from 0.5 μm to 2.0 μm.

3. A memory device of claim 1, in which said dielectric film of said capacitor includes a first silicon oxide film on said upper and lower walls of said trench with a substantially uniform thickness and a silicon nitride film on the surface of said first silicon oxide film, the thickness of said silicon nitride film on said upper wall of said trench being larger than the thickness of said silicon nitride film on said lower wall of said trench.

4. A memory device of claim 3, in which said dielectric film of said capacitor further includes a second silicon oxide film on the surface of said silicon nitride film on said upper and lower walls of said trench with a substantially uniform thickness, whereby said first portion of said dielectric film is constituted by said first silicon oxide film, said thick silicon nitride film and said second silicon oxide film, and said second portion of said dielectric film is constituted by said first silicon oxide film, said thin silicon nitride film and said second silicon oxide film 5. A memory device of claim 3, in which said thickness of said silicon nitride film on said upper wall is 1.5 times or more and 3.0 times or less said thickness of said silicon nitride film on said lower wall of said trench.

6. A memory device of claim 4, in which said first and second silicon oxide films are thermally grown films, and said silicon nitride film is a chemically vapour deposited film.

7. A memory device of claim 4, in which the thickness of said second silicon oxide film ranges from 2 nm to 6 nm.

8. A memory device of claim 1, in which said dielectric film is constituted only by a thermally grown silicon oxide film.

9. A memory device of claim 1 further comprising an impurity region of said one conductivity type and having a higher impurity concentration than that of said substrate, said impurity region surrounding said impurity layer.

10. A dynamic random access memory device comprising a semiconductor substrate of one conductivity type and having a major surface, a transfer gate transistor formed on said major surface of said substrate and having source and drain regions of a conductivity type opposite to said substrate, a trench formed in said substrate from said major surface of said substrate into said substrate, said trench having an upper wall adjacent to said major surface of said substrate and a lower wall adjacent to said upper wall continuously and including a bottom portion, a dielectric film of a storage capacitor, said dielectric film including a first portion provided on said upper wall of said trench and a second portion provided on said lower wall of said trench, said first portion of said dielectric film being thicker than said second portion of said dielectric film, a capacitor electrode continuously formed on said first and second portions of said dielectric films within said trench, and an inversion layer of a conductivity type opposite to said substrate formed on said upper and lower walls of said trench and connected to one of said source and drain regions of said transistor, said inversion layer being produced when a voltage is applied to said capacitor electrode.

* * * * *

UNITED STATES PATENT AND TRADEMARK OFFICE
CERTIFICATE OF CORRECTION

PATENT NO.   : 4,918,503

DATED        : April 17, 1990

INVENTOR(S)  : Yasushi Okuyama

It is certified that error appears in the above-identified patent and that said Letters Patent is hereby corrected as shown below:

Column 4, line 20, delete "82m" and insert --$\mu$m--.

Column 6, line 55, delete "stpes" and insert --steps--.

Signed and Sealed this

Twenty-third Day of July, 1991

Attest:

HARRY F. MANBECK, JR.

*Attesting Officer*   *Commissioner of Patents and Trademarks*